(12) United States Patent
Wang et al.

(10) Patent No.: US 8,415,175 B2
(45) Date of Patent: Apr. 9, 2013

(54) IDENTIFICATION OF DIES ON A SEMICONDUCTOR WAFER

(75) Inventors: Shen Wang, Webster, NY (US); Robert P. Fabinski, Rochester, NY (US); James E. Doran, Ontario, NY (US); Laurel J. Pace, Rochester, NY (US); Eric J. Meisenzahl, Ontario, NY (US)

(73) Assignee: Truesense Imaging, Inc., Rochester, NY (US)

( * ) Notice: Subject to any disclaimer, the term of this patent is extended or adjusted under 35 U.S.C. 154(b) by 0 days.

(21) Appl. No.: 13/160,901

(22) Filed: Jun. 15, 2011

(65) Prior Publication Data

US 2012/0322271 A1    Dec. 20, 2012

(51) Int. Cl.
*G01R 31/26* (2006.01)
*H01L 21/66* (2006.01)

(52) U.S. Cl. ............... 438/14; 438/5; 83/39; 83/495

(58) Field of Classification Search .................. 438/758, 438/5, 14; 83/39, 495
See application file for complete search history.

(56) References Cited

U.S. PATENT DOCUMENTS

| 4,781,942 | A | * | 11/1988 | Leyden et al. | ............ 427/509 |
| 5,294,812 | A | | 3/1994 | Hashimoto et al. | |
| 5,984,190 | A | * | 11/1999 | Nevill | ............ 235/492 |
| 6,623,911 | B1 | * | 9/2003 | Jong et al. | ............ 430/394 |
| 7,749,690 | B2 | | 7/2010 | Woolaway et al. | |
| 2005/0275068 | A1 | | 12/2005 | Brambilla et al. | |

* cited by examiner

*Primary Examiner* — Leonard Chang
(74) *Attorney, Agent, or Firm* — Howard & Howard Attorneys PLLC

(57) ABSTRACT

A semiconductor wafer includes multiple dies and a die identification region adjacent to or on each die. The die identification region can include a wafer indicator and a pattern of die locations representing die locations on the wafer. A die identification marker is provided in each pattern of die locations in the die identification region specifying a location of a respective die on the wafer.

6 Claims, 5 Drawing Sheets

IDENTIFICATION OF DIES ON A SEMICONDUCTOR WAFER

CROSS-REFERENCE TO RELATED APPLICATION

Reference is made to commonly-assigned, U.S. patent application Ser. No. 13/160,885, entitled "IDENTIFICATION OF DIES ON A SEMICONDUCTOR WAFER", filed concurrently herewith.

TECHNICAL FIELD

The present invention relates generally to semiconductor wafer processing, and more particularly to the identification of dies on a semiconductor wafer.

BACKGROUND

Modern integrated circuits are mainly manufactured on semiconductor wafers. Tens, hundreds, or even thousands of identical circuits can be built in a single wafer. Usually dozens of wafers can be manufactured at one time. Once fabricated, the integrated circuits are diced or separated into individual dies and packaged into the final devices. The individual devices are then tested or screened and the devices that fail a test or specification are rejected.

During the manufacturing process, certain processing steps can cause variation or shading of certain characteristics across a wafer. The variation or shading can compromise the performance of the circuits and cause the device to fail a test or specification. This failure reduces the manufacturing yield.

For example, the thickness of a conductive layer, etch uniformity, or the doping concentration of an impurity can vary in the dies based on the location of the dies in the wafer due to the variation or shading of process steps. Usually dies in the wafer center can have different characteristics of certain parameters than the dies on the wafer edge. Dies on the wafer top can have different characteristics from the dies on the wafer bottom. Being able to determine the location of a die in the wafer along with its failure mechanism can help in identifying the cause of a failure and in making improvements in the manufacturing process to reduce the failure rate. But after a semiconductor wafer is diced and packaged, the information regarding the location of an individual die relative to the wafer is lost.

SUMMARY

An aspect of the present invention includes providing a die identification region adjacent to or on each die in a semiconductor wafer having multiple dies. A semiconductor wafer includes multiple dies and a die identification region adjacent to or on each die. The die identification region can include a wafer indicator and a pattern of die locations representing die locations on the wafer. A die identification marker is provided in each pattern of die locations in the die identification region specifying a location of a respective die on the wafer.

According to another aspect, the locations of the multiple dies in the wafer form a wafer pattern. The die identification region can include a wafer indicator and a duplicate wafer pattern having die locations that match the locations of the dies on the semiconductor wafer. A die identification marker is provided in each duplicate wafer pattern identifying the location of a respective die on the semiconductor wafer.

Another aspect of the present invention includes a method for identifying a die on a semiconductor wafer that includes multiple dies. The locations of the multiple dies in the semiconductor wafer form a wafer pattern. The method includes providing a pattern layer on the semiconductor wafer and patterning the pattern layer to provide a die identification region adjacent to or on the die on the semiconductor wafer. The die identification region can include a wafer indicator and a duplicate wafer pattern having die locations that match the wafer pattern. A marker layer is provided over the duplicate wafer pattern. A die identification marker is provided in the marker layer over a respective die location in the duplicate wafer pattern identifying a location of the die on the semiconductor wafer.

BRIEF DESCRIPTION OF THE DRAWINGS

Embodiments of the invention are better understood with reference to the following drawings. The elements of the drawings are not necessarily to scale relative to each other. Like numbers indicate like parts throughout the views.

DETAILED DESCRIPTION

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected or an indirect connection through one or more passive or active intermediary devices. The term "circuit" means either a single component or a multiplicity of components, either active or passive, that are connected together to provide a desired function. The term "signal" means at least one current, voltage, or data signal.

Additionally, directional terms such as "on", "over", "top", "bottom", "left", "right" are used with reference to the orientation of the Figure(s) being described. Because components of embodiments of the present invention can be positioned in a number of different orientations, the directional terminology is used for purposes of illustration only and is in no way limiting. When used in conjunction with layers of a semiconductor wafer or corresponding circuit or device in the semiconductor wafer, the directional terminology is intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

And finally, the term "substrate" is to be understood as a semiconductor-based material including, but not limited to, silicon, silicon-on-insulator (S technology, silicon-on-sapphire (SOS) technology, doped and un-doped semiconductors, epitaxial layers or well regions formed on a semiconductor substrate, and other semiconductor structures.

Figure 1:
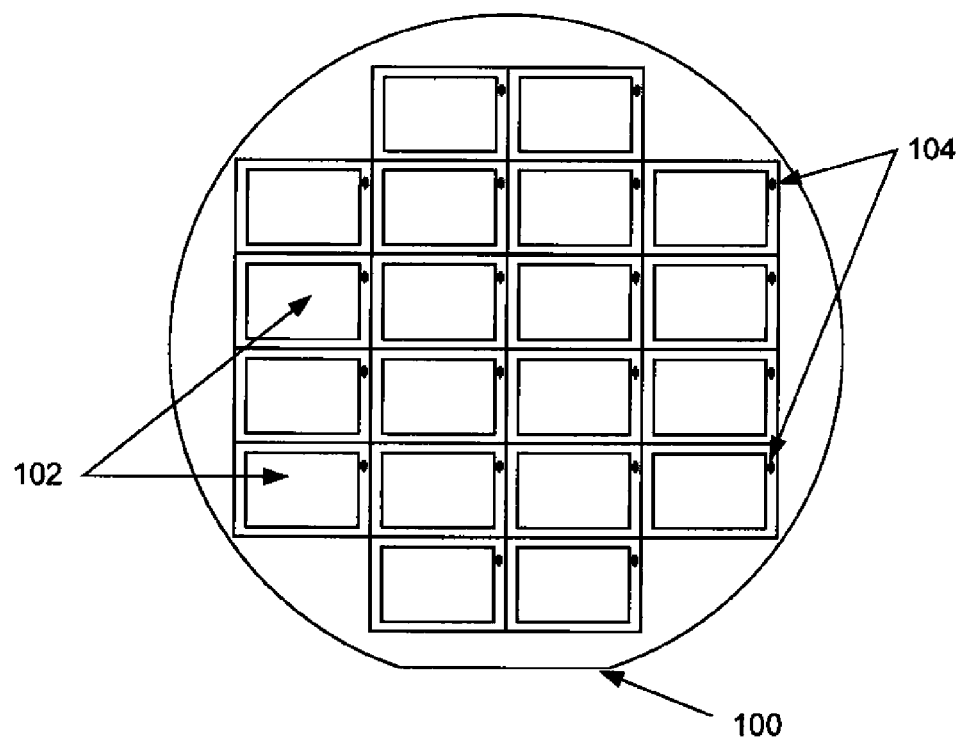
FIG. 1 is a simplified illustration of a semiconductor wafer in an embodiment in accordance with the invention.

Referring now to FIG. 1, there is shown a simplified illustration of a semiconductor wafer in an embodiment in accordance with the invention. Wafer 100 includes multiple dies 102 formed on or in wafer 100. Included on or adjacent to each die 102 is a die identification region 104. Any type of integrated circuit or device can be fabricated in or on wafer 100. By way of example only, charge-coupled device (CCD) or complementary metal oxide semiconductor (CMOS) image sensors can be fabricated in or on wafer 100.

Figure 2:
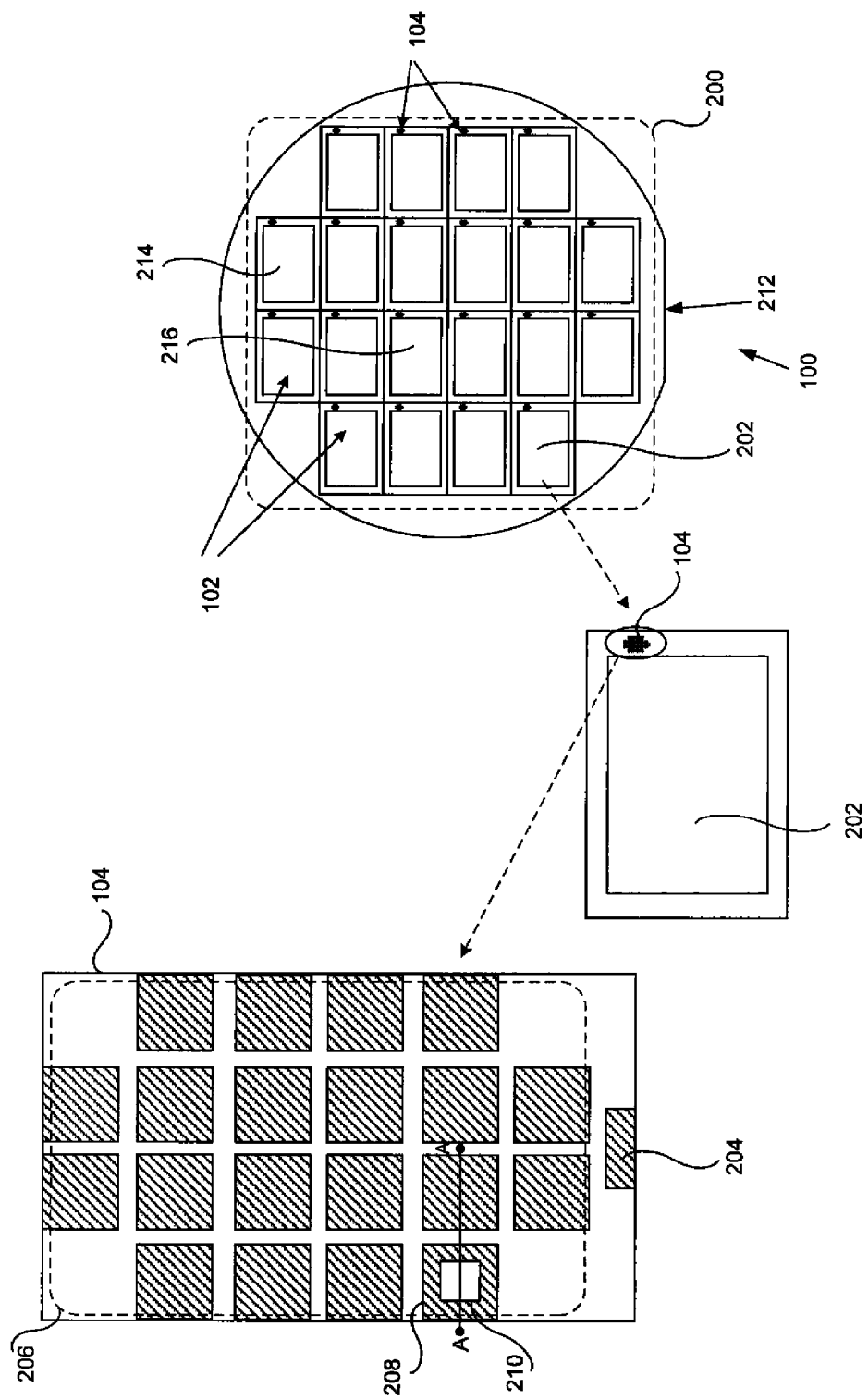
FIG. 2 is an expanded view of wafer 100 shown in FIG. 1 in an embodiment in accordance with the invention.

FIG. 2 is an expanded view of wafer 100 shown in FIG. 1 in an embodiment in accordance with the invention. The locations of dies 102 on wafer 100 form a pattern that is known herein as a wafer pattern 200. An expanded view of die 202 illustrates one example of a location for the die identification region 104. Those skilled in the art will recognize that the location of the die identification region 104 can be different in other embodiments in accordance with the invention.

An expanded view of die identification region 104 includes a wafer indicator 204 and a duplicate wafer pattern 206. Duplicate wafer pattern 206 includes die locations arranged in an exact copy of the wafer pattern 200 on wafer 100 in an embodiment in accordance with the invention. A die identification marker is provided in the duplicate wafer pattern identifying the location of a specific die on wafer. In the illustrated embodiment, die location 208 in duplicate wafer pattern 206 represents the location of die 202 on wafer 100. Die identification marker 210 in duplicate wafer pattern 206 is used to identify the location of die 202 on wafer 100. Except for die location 208, the other die locations in duplicate wafer pattern 206 match each other in appearance or construction. Die identification marker 210 modifies the appearance or construction of die location 208, thereby identifying the location of die 202 on wafer 100.

Wafer indicator 204 is used to identify a position on wafer 100 and assist in orienting or aligning duplicate wafer pattern 206 with wafer pattern 200. The location of a specific die on wafer 100 can be determined using both wafer indicator 204 and die identification marker 210. In the illustrated embodiment, wafer indicator 204 corresponds to the bottom or lower edge 212 of wafer 100. This area is also known as a wafer flat indicator because the edge of the wafer is a straight edge at the bottom of the wafer. Wafer indicator 204 can be situated in different locations in die identification region 104 in other embodiments in accordance with the invention. By way of example only, wafer indicator 204 can be used to identify the upper edge of wafer 100.

Die identification marker 210 differentiates die location 208 in duplicate wafer pattern 206 so that die location 208 can be detected during an optical examination. The optical examination can include the use of various tools such as microscopes. Since an image under a microscope can be reversed, it may be easier to identify the location of a die on a wafer using both the wafer indicator 204 and the die identification marker 210.

Figure 3:
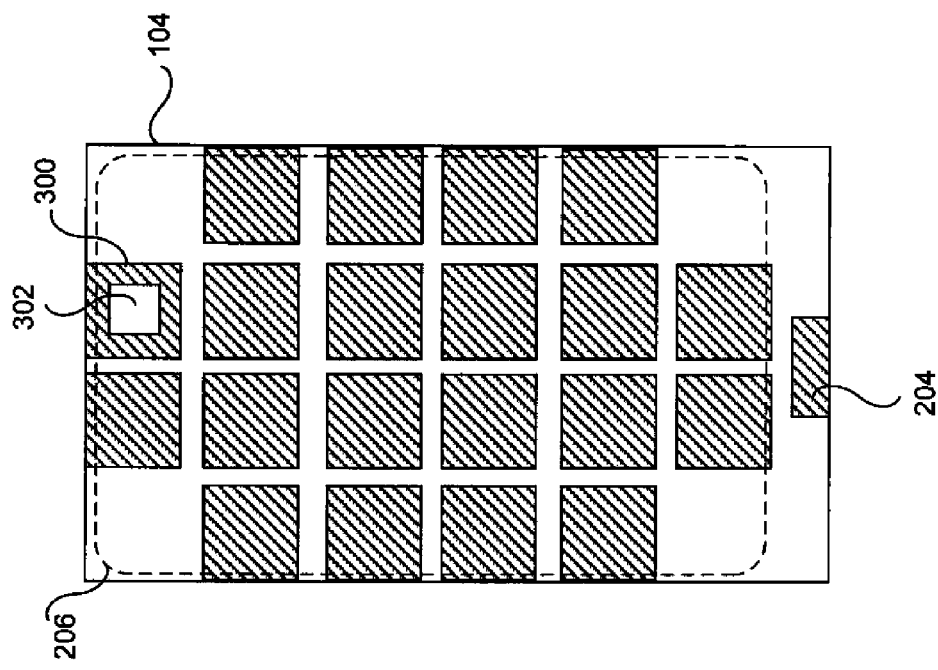
FIG. 3 depicts a die identification marker for die 214 shown in FIG. 2 in an embodiment in accordance with the invention.

The location of a die identification marker 210 in the die identification region is related to the location of a particular die on the semiconductor wafer. FIG. 3 depicts a die identification marker for die 214 shown in FIG. 2 in an embodiment in accordance with the invention. Die location 300 in duplicate wafer pattern 206 represents the location of die 214 on wafer 100. Die identification marker 302 and wafer indicator 204 are used to identify the location of die 214 on wafer 100. The remaining die locations in duplicate wafer pattern 206 match each other in appearance or construction. Die identification marker 302 modifies the appearance or construction of die location 300 in duplicate wafer pattern 206, thereby identifying the location of die 214 on wafer 100.

Figure 4:
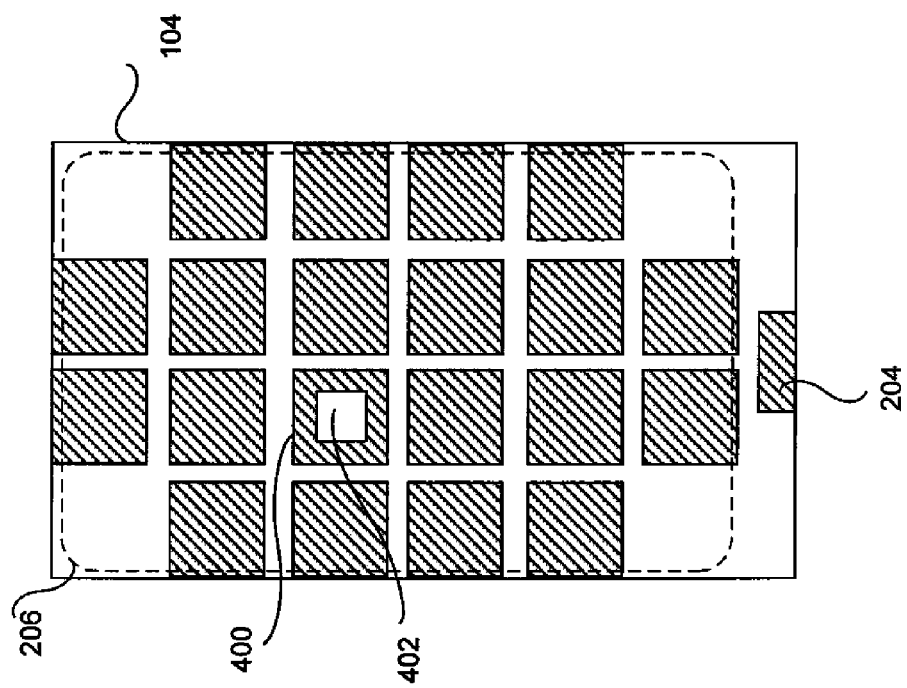
FIG. 4 illustrates a die identification marker for die 216 shown in FIG. 2 in an embodiment in accordance with the invention.

FIG. 4 illustrates a die identification marker for die 216 shown in FIG. 2 in an embodiment in accordance with the invention. Die location 400 in duplicate wafer pattern 206 represents the location of die 216 on wafer 100. Die identification marker 402 and wafer indicator 204 are used to identify the location of die 216 on wafer 100. The other die locations in duplicate wafer pattern 206 match each other in appearance or construction. Die identification marker 402 modifies the appearance or construction of die location 400 in duplicate wafer pattern 206, thereby identifying the location of die 216 on wafer 100.

Figure 5:
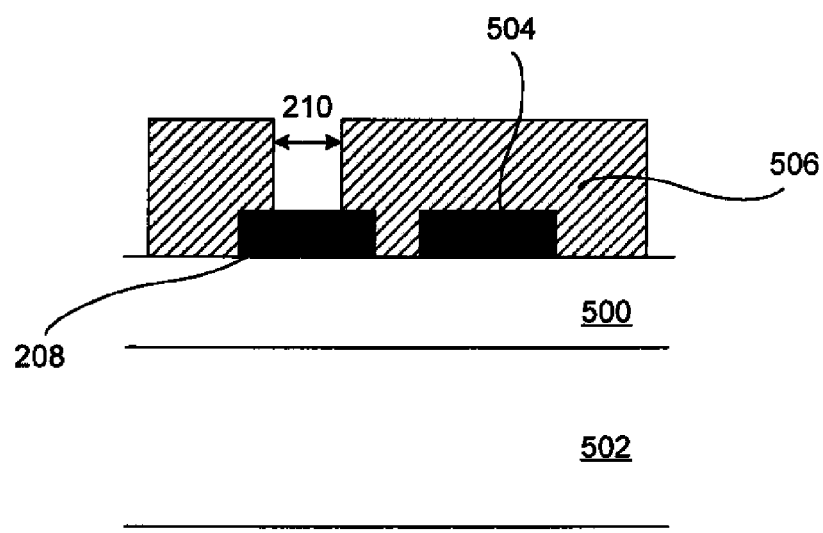
FIG. 5 is a cross-sectional view along line A-A shown in FIG. 2 in an embodiment in accordance with the invention.

Referring now to FIG. 5, there is shown a cross-sectional view along line A-A shown in FIG. 2 in an embodiment in accordance with the invention. Die location 208 is formed on first layer 500 of wafer 100. First layer 500 can be implemented as an insulating layer, such as, for example, silicon dioxide layer in an embodiment in accordance with the invention. First layer 500 is disposed over substrate 502 in the illustrated embodiment.

Die location 504 is the die location immediately adjacent to the right of die location 208. Die locations 208, 504 are formed by a pattern layer and are covered by a marker layer 506. By way of example only, the pattern layer can be implemented as a metal layer and the marker layer 506 as a passivation layer. An opening in marker layer 506 is used as die identification marker 210 in an embodiment in accordance with the invention. The opening in marker layer 506 exposes at least a portion of a surface of die location 208. All of the other die locations in duplicate wafer pattern 206, including die location 504, are covered by marker layer 506. Die identification marker 210, in the form of an opening in marker layer 506, modifies the appearance or construction of die location 208. Die identification marker 210 differentiates die location 208 so that die location 208 can be detected during an optical examination.

Figure 6:
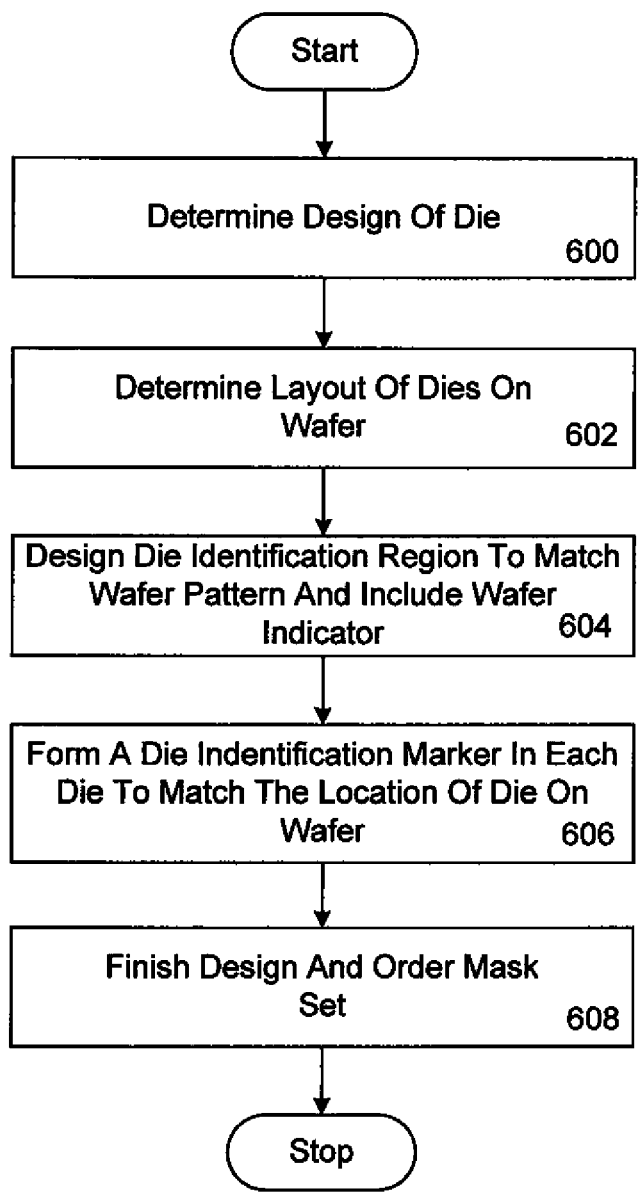
FIG. 6 is a flowchart of a method for producing a die identification region in an embodiment in accordance with the invention.

FIG. 6 is a flowchart of a method for producing a die identification region in an embodiment in accordance with the invention. The design of a die or device and the layout of the dies on a wafer are determined, as shown in blocks 600 and 602. As discussed earlier, the layout of the dies on the wafer is known herein as the wafer pattern.

The die identification region is then determined by designing a duplicate wafer pattern and a wafer indicator (block 604). A die identification marker is positioned in each die to match the location of the corresponding die on the wafer (block 606). The design of the remaining components and circuits for each die are then completed and a mask set for photolithography for the design is then ordered, as shown in block 608.

Figure 7:
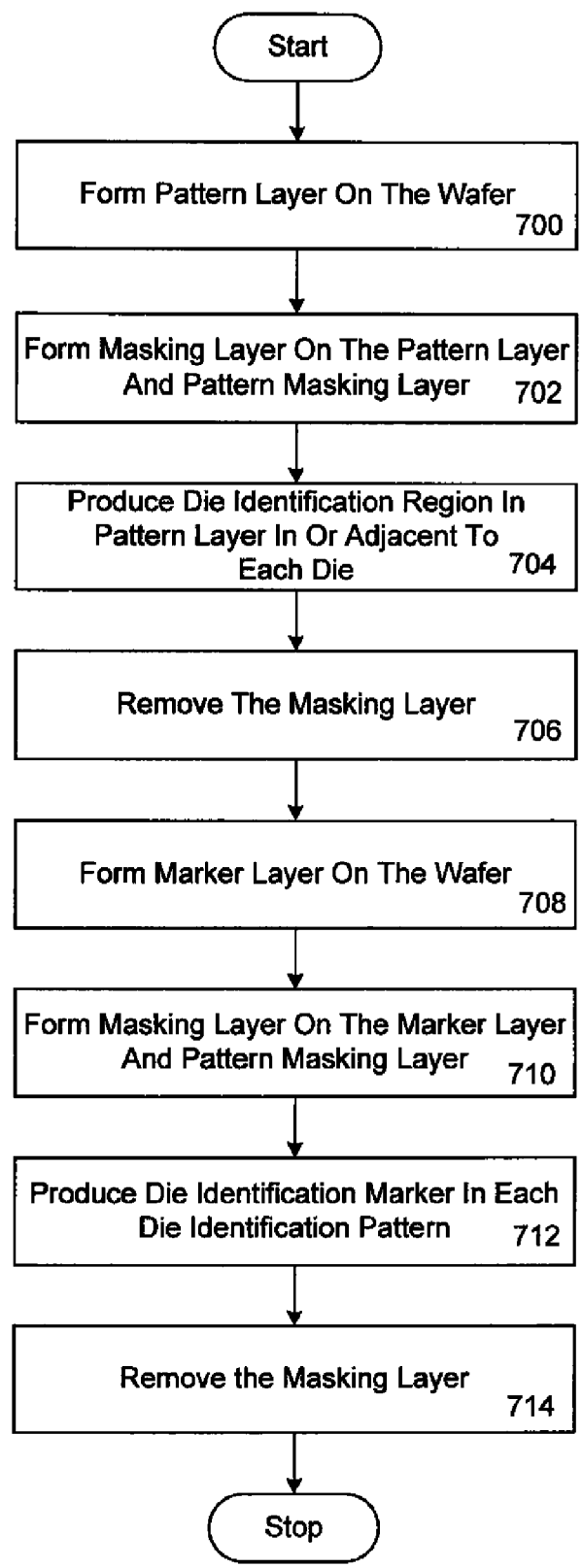
FIG. 7 is a flowchart of a method for producing die identification regions on a wafer in an embodiment in accordance with the invention.

Referring now to FIG. 7, there is shown a flowchart of a method for producing die identification regions on a wafer in an embodiment in accordance with the invention. A pattern layer is formed over the wafer, as shown in block 700. By way of example only, the pattern layer can be implemented as a metal layer in an embodiment in accordance with the invention.

Next, as shown in block 702, a masking layer is formed over the pattern layer and patterned to produce openings in the masking layer that allow the pattern layer to be patterned to correspond to a predetermined die identification region. The pattern layer is then patterned to produce the die identification region adjacent to or on each die on a wafer (block 704). For example, the pattern layer can be etched through the openings in the masking layer to remove unwanted portions of the pattern layer. The portions of the pattern layer covered by the masking layer produce the die locations in the duplicate wafer pattern and produce the wafer indicator.

Next, as shown in blocks 706 and 708, the masking layer is removed and a marker layer is formed over the semiconductor wafer. Another masking layer is then formed over the marker layer. The masking layer is patterned to produce openings in the masking layer that allow the marker layer to be patterned to produce a die identification marker in a die identification region adjacent to each die on the wafer (blocks 710 and 712). For example, the marker layer can be etched through the openings in the masking layer to remove the portion of the maker layer disposed above a respective die location formed by the patterned marker layer in the duplicate wafer pattern. The opening in the marker layer extends to and exposes a surface of the underlying pattern layer at the respective die location in an embodiment in accordance with the invention. The masking layer is then removed, as shown in block 714.

The invention has been described in detail with particular reference to certain preferred embodiments thereof, but it will be understood that variations and modifications can be effected within the spirit and scope of the invention. And even though specific embodiments of the invention have been described herein, it should be noted that the application is not limited to these embodiments. In particular, any features described with respect to one embodiment may also be used in other embodiments, where compatible. And the features of the different embodiments may be exchanged, where compatible.

1. A semiconductor wafer can include multiple dies and a die identification region adjacent to or on each die. The die identification region can include a wafer indicator and a pattern of die locations representing die locations on the wafer. A die identification marker is provided in each pattern of die locations in the die identification region specifying a location of a respective die on the wafer.

2. The semiconductor wafer as in clause 1, where the die identification region includes a pattern layer patterned to provide the pattern of die locations and the wafer indicator and a marker layer disposed over the pattern layer and patterned to provide the respective die identification markers in the die identification pattern.

3. The semiconductor wafer as in clause 2, where the pattern layer can include a metal layer and the marker layer can include a passivation layer.

4. The semiconductor wafer as in clause 2 or 3, where each die identification marker can be an opening in the marker layer that extends to and exposes a surface of the underlying pattern layer.

5. A semiconductor die includes a semiconductor device and a die identification region adjacent to or on the semiconductor device. The die identification region can include a wafer indicator, a duplicate wafer pattern of die locations that correspond to the locations of dies on a semiconductor wafer, and a die identification marker provided in the duplicate wafer pattern.

6. The semiconductor die as in clause 5, where the die identification region can include a pattern layer patterned to provide the duplicate wafer pattern of die locations and the wafer indicator and a marker layer disposed over the pattern layer and patterned to provide the die identification marker in the respective die location in the duplicate wafer pattern.

7. The semiconductor die as in clause 6, where the pattern layer can be a metal layer and the marker layer can be a passivation layer.

8. The semiconductor die as in clause 6 or 7, where the die identification marker can be an opening in the marker layer that extends to and exposes a surface of the underlying pattern layer.

9. A semiconductor wafer can include multiple dies having locations that form a wafer pattern and a die identification region adjacent to or on each die. The die identification region can include a wafer indicator and a duplicate wafer pattern. A die identification marker is provided in each duplicate wafer pattern identifying a location of a respective die on the semiconductor wafer.

10. The semiconductor wafer as in clause 10, where the die identification region includes a pattern layer patterned to provide the pattern of die locations and the wafer indicator and a marker layer disposed over the pattern layer and patterned to provide the respective die identification markers in the die identification pattern.

11. The semiconductor wafer as in clause 10, where the pattern layer can include a metal layer and the marker layer can include a passivation layer.

12. The semiconductor wafer as in clause 10 or 11, where the die identification marker can be an opening in the marker layer that extends to and exposes a surface of the underlying pattern layer.

13. A method for identifying a die on a semiconductor wafer that includes multiple dies having locations that form a wafer pattern, the method including providing a pattern layer on the semiconductor wafer and patterning the pattern layer to provide a die identification region adjacent to or on the die. The die identification region can include a wafer indicator and a duplicate wafer pattern. A marker layer is provided over the die identification region. A die identification marker is provided in the marker layer over a respective die location in the duplicate wafer pattern identifying a location of the die on the semiconductor wafer.

14. The method as in clause 13, where patterning the pattern layer to provide a die identification pattern adjacent to or on the die includes providing a masking layer over the pattern layer and patterning the masking layer. Portions of the patterning layer are removed to provide the die identification pattern adjacent to the die on the semiconductor wafer. The masking layer is removed.

15. The method as in clause 13 or 14, where the pattern layer includes a metal layer.

16. The method as in any one of the preceding clauses, where patterning the marker layer to provide a die identification marker in the marker layer over a respective die location in the duplicate wafer pattern identifying a location of the die on the semiconductor wafer includes depositing a marker layer over the wafer and providing a masking layer over the marker layer. The masking layer is patterned and portions of the marker layer are removed to provide the die identification region adjacent to or on the die on the semiconductor wafer. The masking layer is then removed.

17. The method as in any one of the preceding clauses, where the marker layer includes a passivation layer.

PARTS LIST 100 wafer
102 dies
104 die identification region
200 die pattern
202 die

204 wafer indicator
206 duplicate wafer pattern
208 die location
210 die identification marker
212 bottom edge of wafer
214 die
216 die
300 die location
302 die identification marker
400 die location
402 die identification marker
500 first layer
502 substrate
504 die location
506 marker layer

The invention claimed is:

1. A method for identifying a location, relative to a particular wafer edge, in which a die on a semiconductor wafer is fabricated, the wafer including a plurality of dies having locations that form a wafer pattern, the method comprising:
providing a pattern layer on the semiconductor wafer;
patterning the pattern layer to provide a die identification region adjacent to or on the die on the semiconductor wafer, wherein the die identification region includes a wafer indicator and a duplicate wafer pattern, the wafer indicator indicating an orientation of the duplicate wafer pattern relative to the particular wafer edge;
providing a marker layer over the die identification region;
providing a die identification marker in the marker layer over a respective die location in the duplicate wafer pattern identifying a location of the die on the semiconductor wafer;
separating the die from the semiconductor wafer and the other dies; and
thereafter, examining the die identification region on the die to identify the location, relative to the particular wafer edge, in which the die was fabricated based only on the wafer indicator and the respective die location indicated by the die identification marker.

2. The method as in claim 1, wherein patterning the pattern layer to provide a die identification region adjacent to or on the die on the semiconductor wafer comprises:
depositing a pattern layer;
providing a masking layer over the pattern layer;
patterning the masking layer;
removing portions of the pattern layer to provide the die identification region adjacent to or on the die on the semiconductor wafer; and
removing the masking layer.

3. The method as in claim 1, wherein patterning the marker layer to provide a die identification marker in the marker layer over a respective die location in the duplicate wafer pattern identifying a location of the die on the semiconductor wafer comprises:
depositing a marker layer
providing a masking layer over the marker layer;
patterning the masking layer;
removing portions of the marker layer to provide the die identification region adjacent to or on the die on the semiconductor wafer; and
removing the masking layer.

4. The method as in claim 1, wherein the pattern layer comprises a metal layer.

5. The method as in claim 1, wherein the marker layer comprises a passivation layer.

6. The method as in claim 1, wherein the duplicate wafer pattern contains only die locations corresponding to locations on the semiconductor wafer in which dies are fabricated.

* * * * *